(12) United States Patent
Hamann et al.

(10) Patent No.: US 8,636,406 B2
(45) Date of Patent: *Jan. 28, 2014

(54) APPARATUS FOR THERMAL CHARACTERIZATION UNDER NON-UNIFORM HEAT LOAD

(75) Inventors: Hendrik F. Hamann, Yorktown Heights, NY (US); Madhusudan K. Iyengar, Kingston, NY (US); James A. Lacey, Mahopac, NY (US); Roger R. Schmidt, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/445,641

(22) Filed: Apr. 12, 2012

(65) Prior Publication Data

US 2012/0201004 A1    Aug. 9, 2012

Related U.S. Application Data

(60) Continuation of application No. 12/611,519, filed on Nov. 3, 2009, now Pat. No. 8,210,741, which is a division of application No. 12/048,620, filed on Mar. 14, 2008, now Pat. No. 7,651,260, which is a division of application No. 10/982,575, filed on Nov. 5, 2004, now Pat. No. 8,029,186.

(51) Int. Cl.
*G01N 25/72* (2006.01)
*G01K 3/00* (2006.01)

(52) U.S. Cl.
USPC .............. 374/5; 374/137; 374/152; 374/178; 374/141; 374/29; 374/121; 374/124; 702/130; 324/537; 250/338.1

(58) Field of Classification Search
USPC ........... 374/120, 121, 4, 5, 57, 178, 152, 137, 374/141, 29, 147, 30, 43–45, 124, 166, 374/167; 702/130, 132, 133, 134, 135, 136; 361/679.01, 688; 257/467, 499; 250/559.45, 559.46, 338.1, 559.34; 327/512, 513; 438/122
See application file for complete search history.

(56) References Cited

U.S. PATENT DOCUMENTS 3,504,524 A    4/1970    Maley
(Continued)

FOREIGN PATENT DOCUMENTS

JP    01319740 A    12/1989

OTHER PUBLICATIONS

Dilhaire et al., "Thermomechanical effects in metal lines on integrated circuits analysed with a differential polarmetric interferometer," Microelectronics Reliability, (1998), vol. 38, p. 1591-1597.
(Continued)

*Primary Examiner* — Gail Verbitsky
(74) *Attorney, Agent, or Firm* — Jon A. Gibbons; Fleit Gibbons Gutman Bongini & Bianco PL

(57) ABSTRACT

An apparatus determines cooling characteristics of an operational cooling device used for transferring heat from an electronic device. The operational cooling device is thermally coupled to a heat pipe. The heat pipe has an exposed surface for selective application of heat thereon. Heat from a localized heat source is selectively applied to at least one region of the exposed surface. The heat source is preferably capable of being varied both positionally relative to the exposed surface and in heat intensity. A heat shield is preferably positioned around the exposed surface of the heat pipe to isolate the operational cooling device from the heat from the localized heat source. A temperature detector repeatedly measures a temperature distribution across the exposed surface while the cooling device is in a heat transfer mode. The temperature distribution is then used to thermally characterize the operational cooling device.

18 Claims, 10 Drawing Sheets

(56) References Cited

U.S. PATENT DOCUMENTS

| | | | | |
|---|---|---|---|---|
| 3,842,346 | A | 10/1974 | Bobbitt | 324/522 |
| 4,504,156 | A | 3/1985 | Currie et al. | 374/45 |
| 4,633,371 | A | 12/1986 | Nagy et al. | 361/699 |
| 4,696,578 | A | 9/1987 | Mansuria et al. | 374/45 |
| 4,982,347 | A | 1/1991 | Rackerby et al. | 700/299 |
| 5,713,030 | A | 1/1998 | Evoy | 713/322 |
| 5,911,897 | A | 6/1999 | Hamilton | 219/497 |
| 5,931,580 | A | 8/1999 | Wyland | 374/141 |
| 5,971,608 | A | 10/1999 | Koizumi | 374/5 |
| 6,039,471 | A | 3/2000 | Wyland | 374/43 |
| 6,231,175 | B1 | 5/2001 | Miyakoshi | 347/101 |
| 6,251,706 | B1 * | 6/2001 | Paniccia | 438/122 |
| 6,663,278 | B1 | 12/2003 | Chien et al. | 374/43 |
| 6,735,499 | B2 | 5/2004 | Ohki et al. | 700/299 |
| 6,774,661 | B1 | 8/2004 | Tustaniwskyj et al. | 324/765 |
| 6,786,639 | B2 | 9/2004 | Covi et al. | 374/178 |
| 6,804,622 | B2 | 10/2004 | Bunker et al. | |
| 6,836,131 | B2 | 12/2004 | Cader et al. | 324/760 |
| 6,840,667 | B2 | 1/2005 | Schlagheck et al. | 374/5 |
| 6,917,039 | B2 | 7/2005 | Nicolaides et al. | |
| 6,921,195 | B2 | 7/2005 | Pipe et al. | 374/43 |
| 6,928,380 | B2 | 8/2005 | Chey et al. | 702/130 |
| 6,947,865 | B1 | 9/2005 | Mimberg et al. | 702/130 |
| 6,995,980 | B2 | 2/2006 | Tustaniwskyj et al. | |
| 7,006,209 | B2 | 2/2006 | Levinson | 356/128 |
| 7,117,114 | B2 | 10/2006 | Arabi et al. | 702/132 |
| 7,147,368 | B2 | 12/2006 | Chien | 374/147 |
| 7,167,806 | B2 | 1/2007 | Hamann et al. | 702/136 |
| 7,246,940 | B2 | 7/2007 | Storm et al. | 374/136 |
| 7,334,630 | B2 | 2/2008 | Goodson et al. | 165/104.33 |
| 8,029,186 | B2 | 10/2011 | Hamann et al. | 374/137 |
| 8,038,343 | B2 | 10/2011 | Hamann et al. | 374/137 |
| 2002/0196835 | A1 | 12/2002 | Schonath et al. | 374/45 |
| 2004/0032275 | A1 | 2/2004 | Cader et al. | 324/760 |
| 2005/0114068 | A1 | 5/2005 | Chey et al. | 702/130 |
| 2005/0206397 | A1 | 9/2005 | Miller | 324/754 |
| 2005/0254548 | A1 | 11/2005 | Appel et al. | 374/57 |
| 2006/0060785 | A1 | 3/2006 | Tinnes | 250/338.1 |
| 2006/0152238 | A1 | 7/2006 | Beaman et al. | 324/760 |
| 2008/0054926 | A1 | 3/2008 | Lopez et al. | 324/760 |
| 2008/0082288 | A1 | 4/2008 | Raad | 702/130 |
| 2008/0191729 | A1 | 8/2008 | Blanco et al. | 324/765 |
| 2011/0063937 | A1 | 3/2011 | Eid et al. | 365/226 |
| 2011/0122914 | A1 | 5/2011 | Wang et al. | 374/43 |
| 2012/0002363 | A1 * | 1/2012 | Tatsukami et al. | 361/679.21 |

OTHER PUBLICATIONS

Boles and Cengel, Thermodynamics: An engineemg approach, 2002, McGraw-Hill, $4^{th}$ Ed., p. 193-195.

* cited by examiner

104    PRIOR ART

APPARATUS FOR THERMAL CHARACTERIZATION UNDER NON-UNIFORM HEAT LOAD

CROSS-REFERENCE TO RELATED APPLICATIONS

This application is based on and claims priority from U.S. patent application Ser. No. 12/611,519 filed on Nov. 3, 2009, now U.S. Pat. No. 8,210,741, which is based on and claims priority from U.S. patent application Ser. No. 12/048,620, filed on Mar. 14, 2008, now U.S. Pat. No. 7,651,260, which is based on and claims priority from U.S. patent application Ser. No. 10/982,575, filed on Nov. 5, 2004, now U.S. Pat. No. 8,029,186. The entire disclosure of each of the above-referenced patent applications is hereby incorporated by reference in its entirety.

BACKGROUND OF THE INVENTION

1. Field of the Invention

This invention relates in general to characterizing cooling devices and cooling packages for electronic components and more particularly, to an apparatus and method of thermal characterization of a cooling device under non-uniform heat loads.

2. Description of the Related Art

Microprocessor performance has improved significantly over the last decade. To effect this improvement in device performance, the density of circuitry has increased. More and more transistors are fabricated in smaller chip size. This has in turn, led to an exponential rise in package power densities, and this trend is expected to continue into the foreseeable future. Almost all the electrical energy consumed by the chip package is released into the surroundings as heat, which thus places an enormous burden on the cooling device and cooling package.

Existing cooling technologies typically utilize air or water to carry the heat away from the chip. Heat sinks with heat pipes or vapor chambers are commonly used air-cooling devices, while cold-plates, of mini and micro scales, are most predominant in water-cooling. These devices are attached to the silicon chip via a thermal interface. In many cooling packages, three components can be distinguished: i) the cooling device; ii) the thermal conductive interface between the cooling device and the chip; and iii) the chip or semiconductor device itself. Each of these is described further below. In the following, for discussion purposes, the cooling device is referred to as the heat sink which may comprise a fan, copper fins, a cold plate, mini-channels, mini-ducts, micro-channels, micro-ducts, and other similar structures. The cooling package includes the cooling device, the electronic device such as a semiconductor chip, and a thermal interface material between the chip and the cooling device.

FIGS. 1 and 2 show prior art air-cooled and liquid-cooled chip, respectively. Referring to FIG. 1, an air-cooled fin-type heat sink 102 is coupled to a silicon chip 104. The heat sink 102 includes a plurality of cooling fins 106 that are made of a highly thermally conducting material such as copper or aluminum. The fin structure maximizes surface area and extracts the heat away from the chip, and transfers the heat to an ambient environment 108. The heat sink 102 can also includes an internal heat pipe 110 having a wick structure and located between the cooling fins 106 and the chip 104 and a thermally conductive plate 112 located between the heat pipe 110 and the chip 104. Finally, a thermally conductive interface 114, such as grease, epoxy, or solder, couples the heat sink 102 to the chip 104 and allows heat to transfer from the chip 104 to the heat sink 102. For reference purposes, the whole structure 100 is referred to as the cooling "package."

Referring now to FIG. 2, a liquid-cooled heat sink 202 is shown coupled to a silicon chip 104. The liquid-cooled heat sink 202 is a sealed environment that does not necessarily rely on the environment for heat dissipation, but instead provides a path for the circulation of liquid. The liquid is able to carry away a portion of the heat to a chiller or some other heat extractor (which could be the environment). The liquid cooled heat sink 202 is coupled to the chip 104 by a thermally conductive interface 114. Similar to that shown in FIG. 1, the cold plate 202 of FIG. 2 is the actual cooling device while the whole structure 200 is referred to as the cooling package. Cooling package 200 includes the interface 114 and the chip 104. It should be noted that the cold plate 202 comprises mini-channels, micro-channels, mini-ducts and micro-ducts and other forms of macro/mini/micro coldplates.

In addition to a general rise in the power dissipation due to the above-mentioned increase in transistor density, microprocessors and other circuitry have been optimized for performance, which has resulted in high heat zones or areas on the device. These zones display much higher power densities and lead to 'hot spots' on the chip. FIG. 3 is a prior art chip power map showing power distribution. FIG. 4 depicts a prior art temperature distribution on the surface of the cooling device, resulting from the power map of FIG. 3 when the device 104 is cooled as discussed with reference to prior art structures. The spatial non-uniformity of the chip's power distribution causes a corresponding non-uniformity in power and temperature on the surface of the cooling device that is in contact with the chip by means of the thermally conductive interface 114. This phenomenon can adversely affect the thermal performance of the cooling device, which is typically designed to function and tested under a more spatially uniform heat load.

Heat pipes 110 or vapor chambers have an evaporator section (not shown) that uses known liquid phase change via evaporation or boiling of the resident liquid. This enables the extraction of large amounts of heat from the chip surface. Both evaporation and boiling rates, are significantly influenced by the magnitude of heat flux and heat flux distribution over the surface in contact with the liquid undergoing phase change. Specifically, degradation in cooling ability of the heat pipe 110 occurs at areas of high power density within the device. Thus, when employing a heat pipe or a vapor chamber to cool a microprocessor or an electronic device, if there is a large non-uniformity in the power density of the chip, the boiling and/or evaporation in the evaporator region over the chip and interface will also be non-uniform. The resultant cooling heat transfer coefficient is a dependent function on the local heat flux distribution on the evaporator surface.

To illustrate this principle, FIG. 5 shows a prior art fully-operational silicon chip 104. The chip 104 has three distinct power density areas: a low power density area 502; a moderate power density area 504; and a high power density 506. Located directly above and coupled to the chip 104 is a heat pipe 110 containing a liquid 508. Within the heat pipe 110 and directly above the moderate power density area 504 of the chip 104, is an area 514 where the liquid 508 is boiling. At this point, the phase change is rapidly occurring and the cooling effect of the heat pipe 110 is at a maximum. At area 512, directly above the low power density area 502 of the operating chip 104, is an area of little phase change in the cooling liquid 508 (most commonly water), and, therefore, reduced cooling of the chip 104. Finally, at area 516, directly above the high power density area 506 of the chip 104, an excess amount of vapor generation is occurring in the liquid 508. The excess amount of vapor generation creates a blanket of vapor 518 that prevents the liquid 508 from contacting the plate 112 and efficiently dissipating the heat from the plate 112, thereby causing the cooling coefficient of the cooling device 110 to drop off rapidly.

FIG. 6 a prior art graphic illustrates how the variation of a boiling or evaporation cooling coefficient is a function of input power density. Three points along the graph 612, 614, and 616, correspond to the same areas, 512, 514, and 516, in FIG. 5. In FIG. 6, it can be seen that the cooling coefficient increases with power density until it reaches an optimal value 614, after which it reduces sharply Thus, under these circumstances it is advantageous to understand and design for, the thermal behavior of the cooling device under non-uniform chip heat load. To enable this understanding and design, it is desirable to characterize and measure the performance of these cooling devices when they are subjected to this spatially non-uniform chip power. Also, the chip power density is dependent on the application, i.e. the nature of its activity. Thus, the same chip under different applications will possess a different power density. Therefore, it is also desirable to design for a flexible or dynamically changing power map.

SUMMARY OF THE INVENTION

Briefly, in accordance with the present invention, disclosed is a method and apparatus for application of a non-uniform heat load to a cooling device, as well as a measurement and characterization of the thermal performance of: (i) the cooling device only; (ii) the complete cooling device package (i.e. cooling device, thermally conductive interface and chip); and (iii) the thermal conductive interface only. The inventive method and apparatus do not require physical coupling of measurement equipment to the device under test and, therefore, provide many benefits over the use of resistance heaters for power applications, thermocouples, and IR thermal imaging for temperature measurement. The method and device disclosed herein will also allow for rapid variation of hot spot or high power density locations on the device under test.

In one embodiment, the present invention comprises an apparatus for thermally characterizing an operational cooling device for a processing device, wherein the apparatus comprises an operational cooling device, a localized heat source that is applied to at least one region on the cooling device, and a temperature detector for measuring a temperature distribution.

The cooling device is of the type commonly used to cool microprocessors in computing applications and is coupled to an electronic device for the purpose carrying away heat during operation of the electronic device. Exemplary embodiments of the cooling device are heat pipes, vapor chambers, cooling fins, or cold plates cooled by either a group of macrochannels, micro-channels, mini-channels, micro-ducts, mini-ducts and/or a fan assembly. The cooling device can also be other structures useful for cooling computer chips or other similar electronic devices.

Localized heat is applied to the cooling device through the use of a heat generator, which can be a laser, a focused lamp, a directed convective heat flow generator, a heat element, an electromagnetic radiator, or any other device capable of generating and transferring focused heat. In one embodiment, the heat generator is laser and a beam splitting optical element (Wollaston prism) is utilized to split a laser beam produced by the laser into two paths so that the cooling device receives two separate focused heating areas. The focused heat source can also be repositioned and applied to a plurality of locations on the device so that the effect of non-uniform heat in each area can be discerned.

In another embodiment of the present invention, a bias heat is also applied to the cooling device by a bias heat source. The bias heat source applies more or less uniform heat to a larger area of the cooling device and can be realized by a heat gun or any other similar device capable of applying uniform heat to an entire area. In other cases a very slightly focused UV-lamp or a diode laser array may be used. Adding the bias heat in conjunction with a focused heat source more closely simulates the heat characteristics of an electronic device than does a single focused heat source. In fact, in one embodiment, the bias heat is generated by coupling an electronic device, or "test chip" to the cooling device and operating the test chip in a uniform heat-generating manner. In the embodiment utilizing the test chip, the focused heat from the laser or others heat generators can be applied to locations on the test chip itself.

The temperature detector can be a photon detector that receives a thermal image of the area on the cooling device and uses the thermal image to determine the temperatures on the device. An example is an IR thermal imager or a fluorescence imager (where the fluorescence or phosphorescence lifetime of a molecule which was applied to the cooling device is temperature dependent), and/or a CCD camera, which detects the temperature dependent thermal reflectance of the device.

In yet another embodiment, the cooling device is coated with a blackbody coating to help absorb the laser beam and increase the emissivity of the cooling device, which improves the temperature measurements. In other embodiments, the test chip is coated with the blackbody coating. In still other embodiments, a layer of the blackbody coating is placed between the test chip and the cooling device in order to measure the thermally conductive interface between the chip and cooling device.

BRIEF DESCRIPTION OF THE DRAWINGS

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

Figure 1:
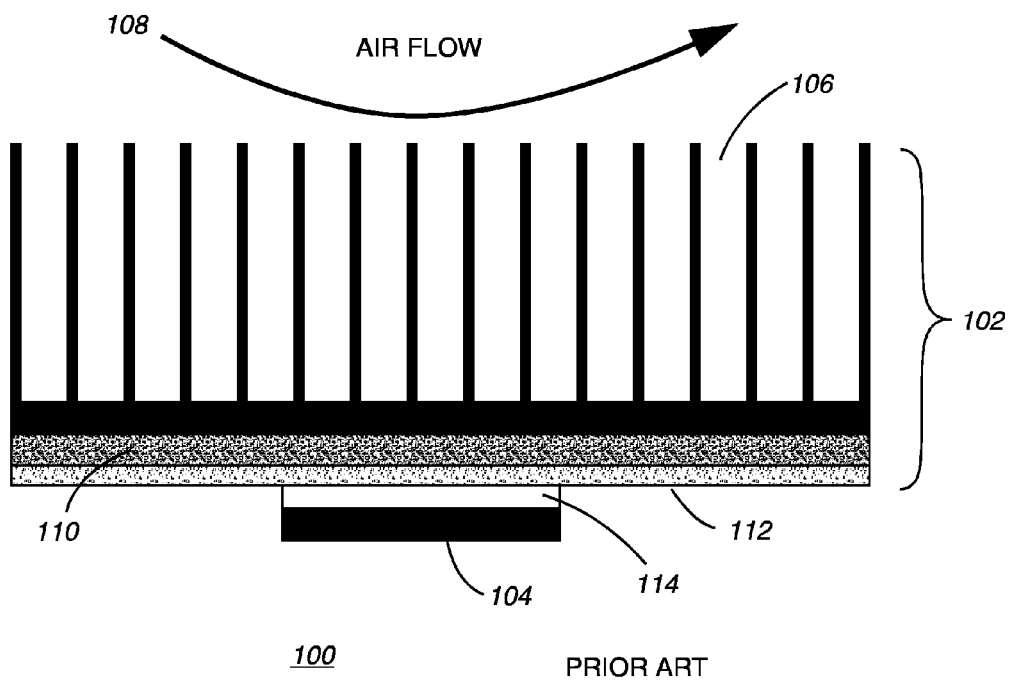
FIG. 1 is a cross-sectional diagram of a prior art heat sink coupled to an electronic device.
Figure 2:
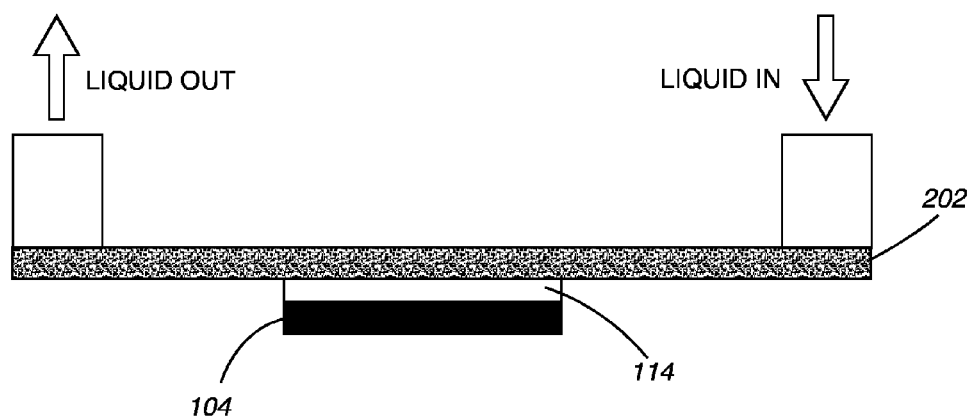
FIG. 2 is a cross-sectional diagram of a second embodiment of a prior art heat sink coupled to an electronic device, specifically a liquid cooled cold plate.
Figure 3:
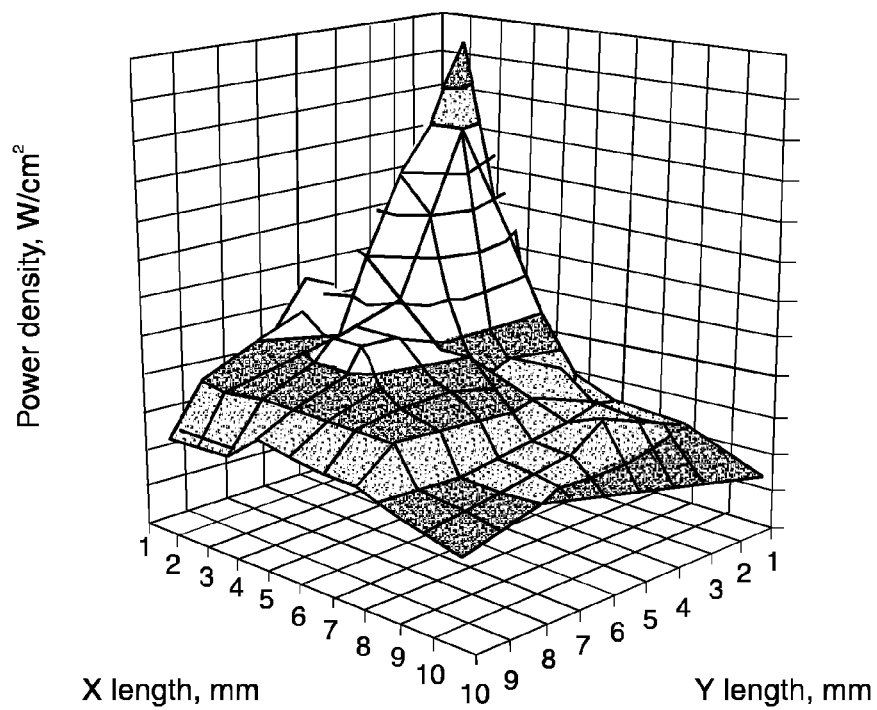
FIG. 3 is a three-dimensional power distribution map of an operational prior art electronic device.
Figure 4:
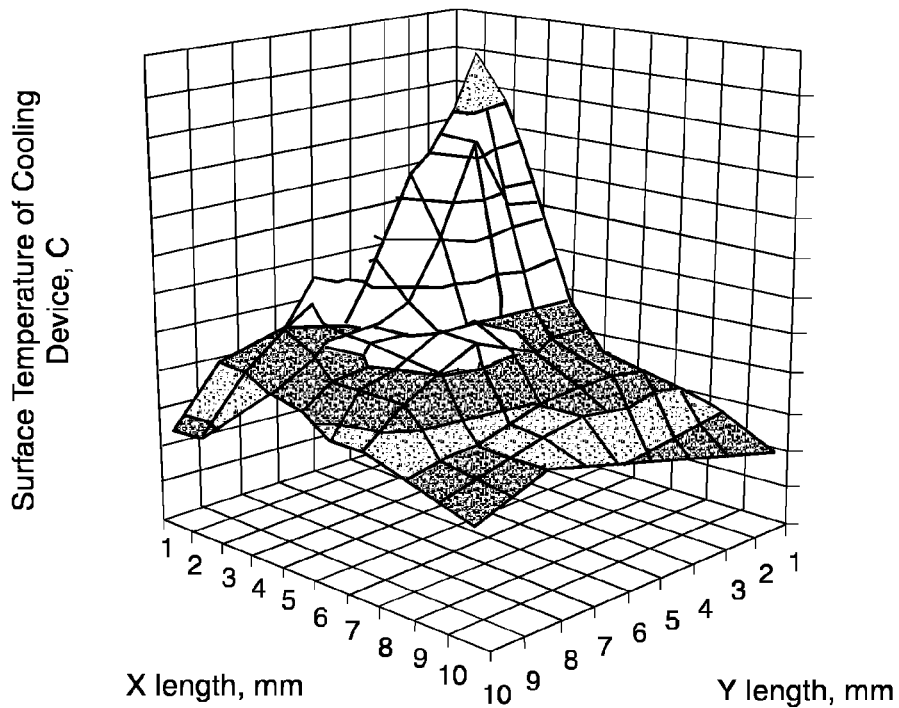
FIG. 4 is a three-dimensional temperature distribution map of an operational prior art cooling device attached to an operational electronic device.
Figure 5:
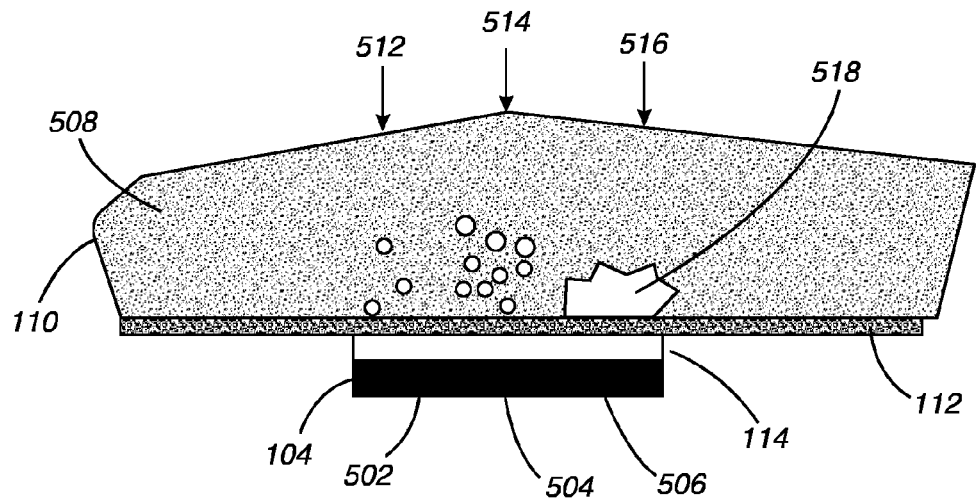
FIG. 5 is a cross-sectional diagram of a prior art operational heat pipe coupled to an electronic device.
Figure 6:
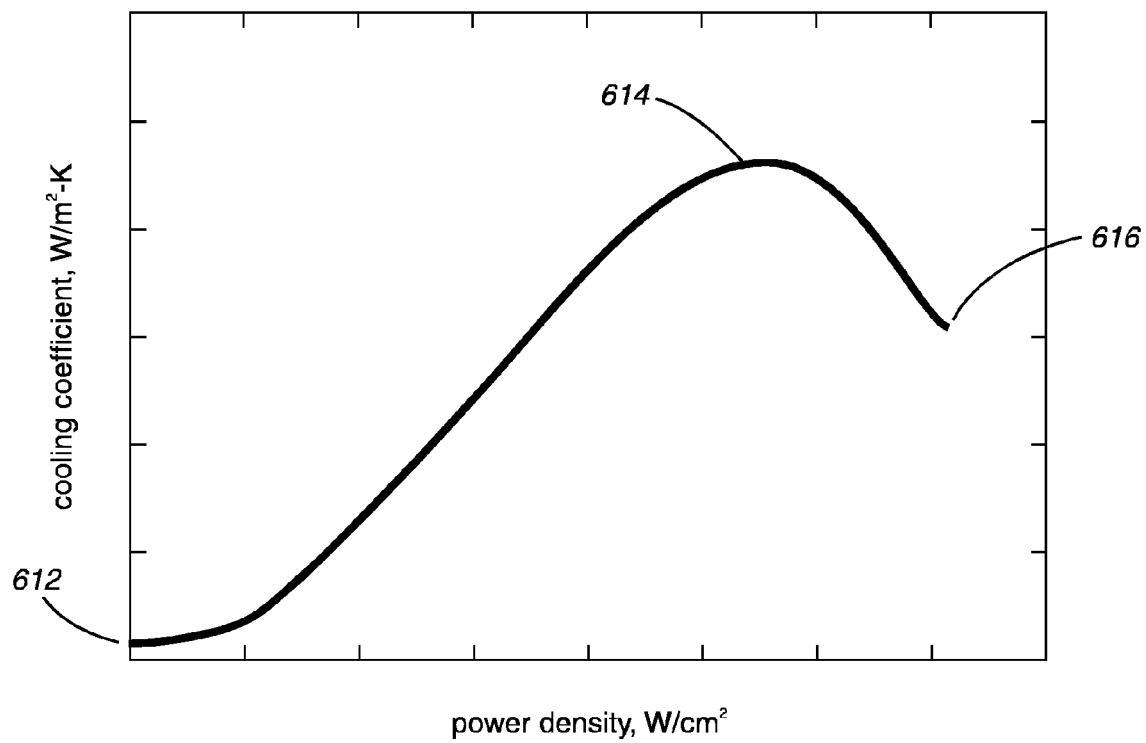
FIG. 6 is a prior art graphical illustration of the cooling coefficient of an embodiment of a cooling device, namely an air cooled heat sink with a vapor chamber, compared to the power density of an electronic device.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality. In the drawings, like numerals refer to like parts through several views.

While the specification concludes with claims defining the features of the invention that are regarded as novel, it is believed that the invention will be better understood from a consideration of the following description in conjunction with the drawing figures, in which like reference numerals are carried forward.

Electronic Device

Figure 7:
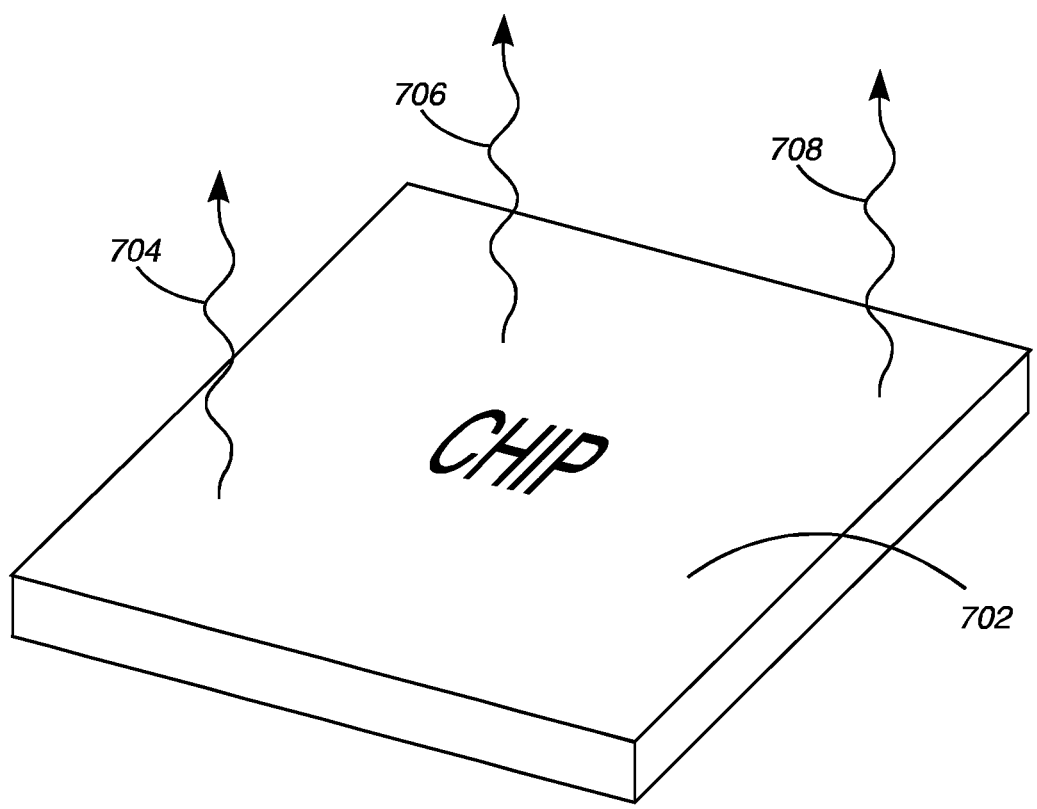
FIG. 7 is a block diagram illustrating a prior art electronic device, under load and emanating heat.

FIG. 7 shows a prior art electronic device 104 (previously shown in FIG. 1), having a top surface 702 emanating heat. The particular device shown is an electronic device composed of passive (e.g. resistors, diodes, capacitors and inductors) and/or active components (e.g. gates and transistors). The electronic device includes memory devices, dedicated and general purpose microprocessors, microcontrollers and alike. These electronic devices are constructed over organic and inorganic circuits with internal communication paths using electric current and/or light and/or other electromagnetic waves. Heat emanations are shown as arrows 704, 706 and 708 rising from the device 104. Note that heat 704, 706 and 708 originates from different locations on the top surface 702 of electronic device 104. Typically, heat is a product of power dissipation within the device 104 under operating conditions, and therefore heat increases in proportion to power.

Distribution of Heat and Power

Figure 8:
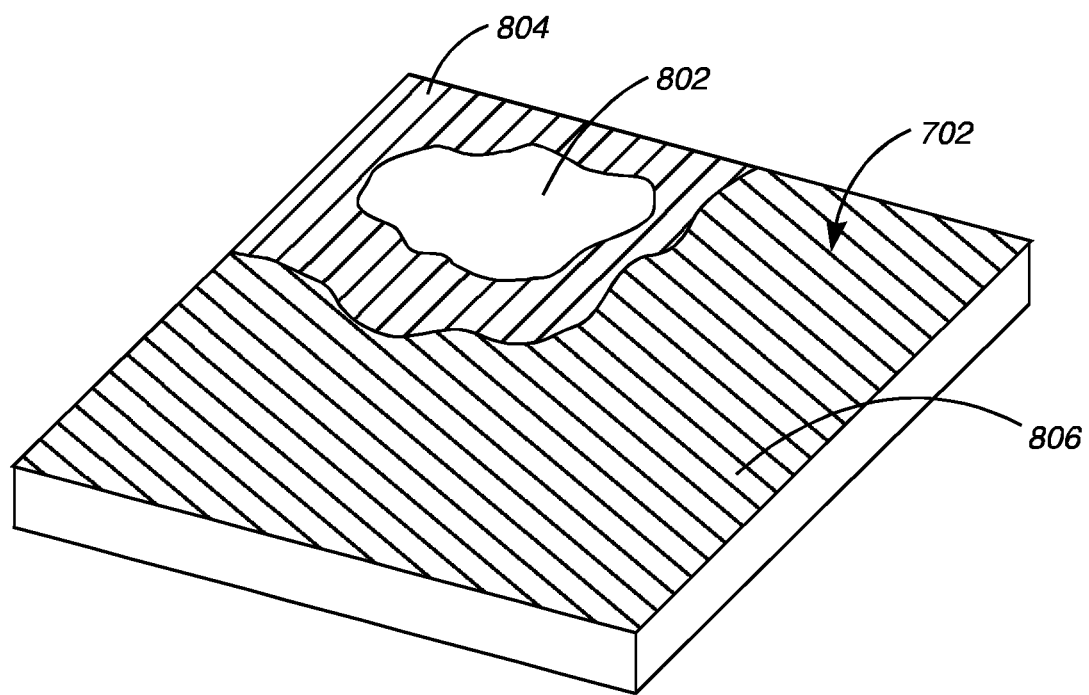
FIG. 8 is an exemplary prior art graphical representation of a thermal distribution generated by the electronic device of FIG. 7.

FIG. 8 is an exemplary prior art graphical representation of a temperature distribution generated by the device in FIG. 7. FIG. 8 graphically shows the presence of non-uniform temperature distributions on the top surface 702 of the electronic device 104. The top surface 702 of the electronic device 104 is divided into three different shaded areas 802, 804, and 806. Each shaded area 802, 804, and 806 refers to a temperature interval. For example, shaded area 802 may refer to a temperature interval of about 75-90 degrees Centigrade, shaded area 804 may refer to a temperature interval of about 55-75 degrees Centigrade and shaded area 806 may refer to a temperature interval of about 30-55 degrees Centigrade. Thus, in relation to the other temperatures on the top surface 702 of the electronic device 104, area 802 represents the highest concentration of heat dissipation, known as a "hot spot". A challenge in the development and design of cooling devices is the removal of excessive heat and non-uniformities in heat and power loads.

Cooling Device

Described now is an exemplary embodiment of the present invention. Referring to FIG. 1, an air-cooled fin-type heat sink assembly 102 is coupled to a silicon chip 104. The heat sink assembly 102 includes a plurality of cooling fins 106 that are made of a thermally conductive material such as copper or aluminum. The fin structure maximizes surface area and extracts the heat away from the chip 104, and rejects it to an ambient environment 108. The heat sink assembly 102 can also include an internal heat pipe or vapor chamber structure 110 located between the cooling fins 106 and the chip 104 and a thermally conductive plate 112 located between the heat pipe 110 and the chip 104. Finally, a thermally conductive interface 114, such as grease, epoxy, solder, or liquid metal paste couples the heat sink 102 to the chip 104 and allows heat to transfer from the chip 104 to the heat sink 102.

In other embodiments, the cooling device is a liquid-cooled heat sink 202. The liquid-cooled heat sink 202 is a sealed environment that does not necessarily rely on the ambient environment for heat dissipation, but instead provides a path for the circulation of liquid over the chip 104. The liquid is able to carry away a portion of the heat to a chiller or some other heat extractor. Liquid cooled heat sinks are also coupled to the chip by a thermally conductive interface 114. The difference in temperature between the inlet and outlet of the cooled block can be used, in conjunction with the flow rate (volumetric or mass flow), to determine the power absorbed from the laser.

Heat Pipe

Figure 9:
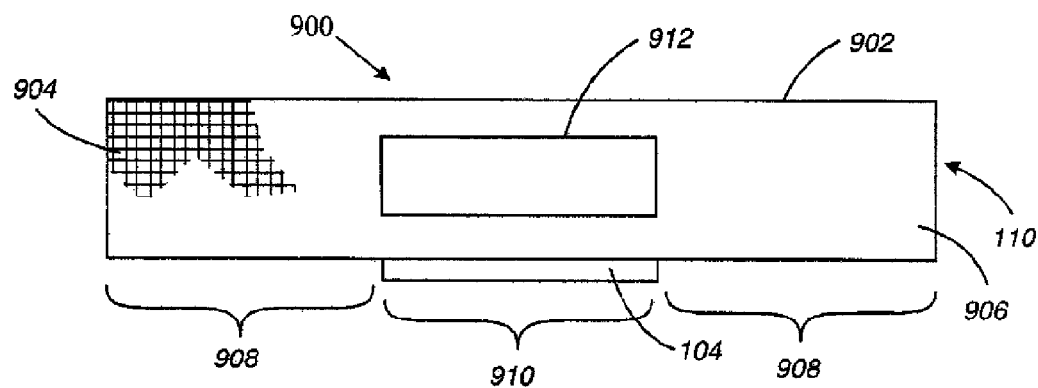
FIG. 9 is a cross-sectional diagram of the operational prior art heat sink of FIG. 1.

Referring now to FIG. 9, a prior art heat pipe 110 is shown. A heat pipe 110 is a device that can quickly and efficiently transfer heat from one point to another. The heat pipe 110, or vapor chamber 900, comprises a sealed chamber 902 surrounding a capillary wicking material 904, a central cavity for vapor flow known as a vapor core 912, and a working fluid 906 (commonly water). The sealed chamber 902 isolates the working fluid 906 from the outside environment. The sealed chamber 902 should, therefore, be leak-proof, maintain the pressure differential across its walls, and enable transfer of heat to take place from and into the working fluid 906.

The primary purpose of the vapor core 912 is to transport vapor from an evaporator section 910 where it absorbs the latent heat of vaporization to a condenser region 908 where it releases this heat, thereby enabling heat transport from one part of the vapor chamber 900 to another. The prime purpose of the wicking material 904 is to generate capillary pressure to transport the working fluid 906 from the condenser region 908 at either end of the heat pipe 110 to an evaporator section 910 located adjacent to a heat source 104 coupled to the heat pipe 110. The wicking material 904 is porous and creates an evaporation-condensation cycle that transports heat and drives the condensate back to the evaporator section 910 by the capillaries in the wick wicking material 904.

When heat is applied at one or more points along the outer surface of the sealed chamber 902, the working fluid 906 evaporates or boils and enters a vapor state. During this process, the working fluid 906 picks up the latent heat of vaporization. In its gaseous form, the working fluid 906 has a higher pressure and is drawn to cooler locations via the vapor core 912 within the sealed chamber 902, where it condenses. In this way, heat is transported from the input, or evaporator section 910, to the output end, or ends, or condenser region 908, of the heat pipe 110.

Method and Apparatus for Characterization of Temperature of Cooling Device Under Highly Non-Uniform Heat Load It will now be shown that for the first time characterization of the temperature removal capability of a fully operational cooling device under highly non-uniform heat load is possible. As will be apparent from the following discussion, an external heat source and device for measuring the resultant temperature, while the device is fully operational, allows the thermal characterization of the cooling device.

Figure 10:
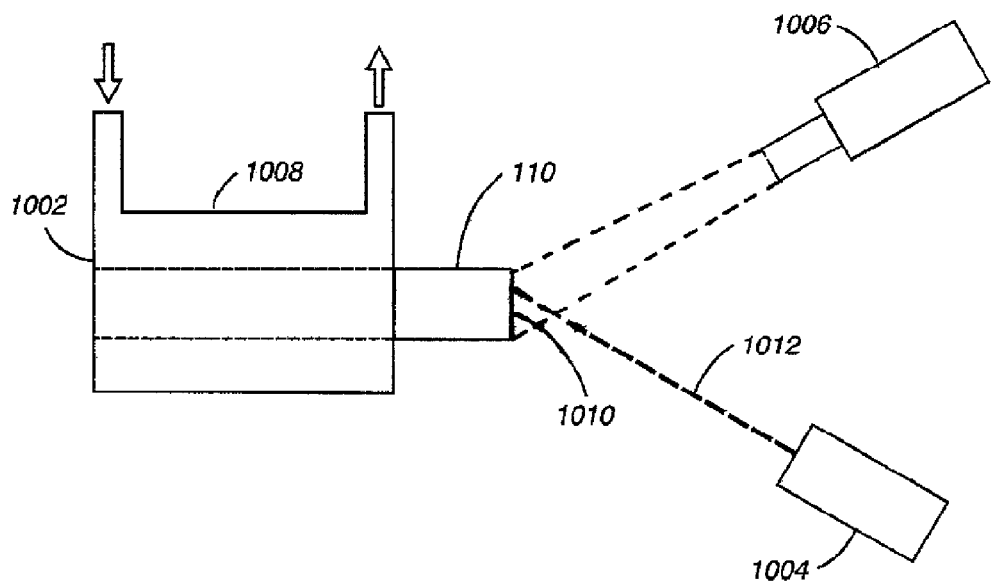
FIG. 10 is a cross-sectional diagram of an operational heat pipe encased in a cooling block and the application of a focused heat source to the heat pipe and the detection of thermal characteristics by a thermal detector, according to an embodiment of the present invention.

FIG. 10 is a cross sectional diagram depicting one embodiment of the present invention. FIG. 10 shows a cooling device 1002, which includes a water-cooled cold block 1008 partially encapsulating a heat pipe 110. Also shown in FIG. 10 is a heat source 1004, and a means for measuring temperature distribution 1006.

Temperature Detector

Any kind of thermal detector can be used but a photon-detector is able to accurately and remotely measure a temperature distribution on a device. A photon-detector detects photons comprising the luminescence from the electronic device, which may be temperature dependent. In another scheme the optical reflectance may be used. In this case a broadband lamp (preferably an LED) would illuminate the surface 1010 and a CCD camera would measure the change in reflectance. The photons change optical reflectivity with temperature. Infrared detection using a camera 1006 will be shown and discussed throughout the remainder of this specification, however, it is important to note that other types of photon detection and photon detectors are within the true scope and spirit of the present invention. In order to enhance the IR temperature measurement a black body coating may be used. A typical coating may be black paint. In some cases it is necessary to apply this blackbody coating very thinly in order to ensure that the thermal measurements are not disturbed significantly. In other embodiments of the present invention, alternative temperature sensing techniques could be implemented, such as thermal reflectance and fluorescence imaging.

The function of the illustrative infrared camera 1006 is to capture thermal information of the cooling device 1002 during operation. More specifically, the infrared camera 1006 is able to capture thermal information of a surface 1010 of the heat pipe 110 as a function of position of a localized heat source 1004. Thus, the infrared camera 1006 captures and records thermal information and position information for each temperature reading. This allows the generation of a thermal distribution profile of the surface 1010 of the heat pipe 110. In FIG. 10 the surface 1010 may be coated with a black body coating. For instance, the camera 1006 can identify the distribution of heat from a localized heat source applied to the surface 1010 of the heat pipe 110. The distribution can vary depending on the power level of the heat source applied and the cooling characteristics of the cooling device 1002.

Heat Source

Referring still to FIG. 10, a heat source 1004 is shown being applied to surface 1010 of heat pipe 110. In one embodiment, the heat source 1004 is a focused laser beam, however, many other techniques and devices for applying a heating power to the device 1002 will work equally as well to realize the objects of the present invention including contact and not contact heating methods working by heat convection, heat conduction or heat radiation or a combination of all three. These heating methods include lasers, focus lamps, resistive heaters, directed convection flow and heat elements. A simple 5 W laser can easily realize 500 W/cm2 by only slightly focusing the laser beam on an 1 mm$^2$ area. If higher peak power densities are required, the beam can be focused tighter or a higher power laser will be used.

A blackbody coating can greatly enhance the absorption and control the absorption of the laser power on the surface 1010. The absorption can be measured independently by monitoring, using a standard photo detector, the amount of reflected and incident light assuming that the transmitted light is very small (which is a very good assumption).

As explained above, a chip 104 may have one or more "hot spots" of a maximum temperature that a cooling device is expected to thermally reduce. So that it can be determined how the cooling device will handle hot spots of varying temperatures and locations, the focused heat source 1004 is applied to selected regions of the surface 1010 of the cooling device 1002 to mimic hot spots. The beam 1012 can be aimed at various locations on the surface 1010 to test a plurality of hot spot areas.

Figure 11:
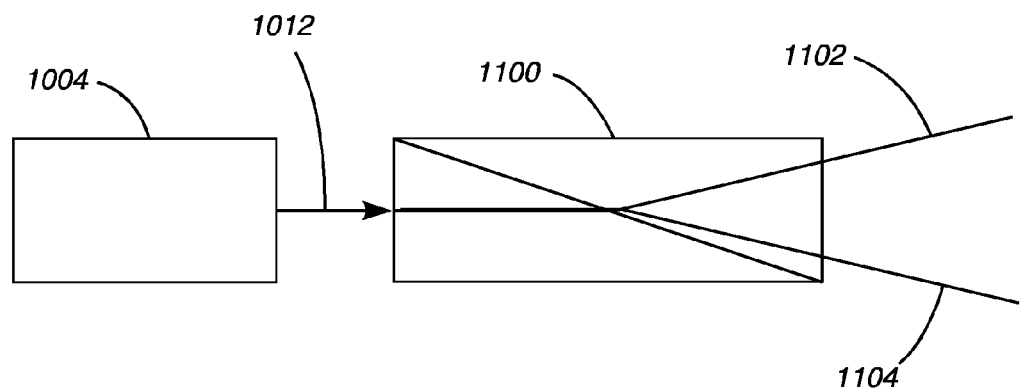
FIG. 11 is a graphical illustration of a single laser beam being split into two laser beams by the use of a Wollaston prism, according to an embodiment of the present invention.

Because it is not uncommon for some chips to have more than one hot spot, it may be desirable to apply more than one focused heating laser beam to the surface at a given time. FIG. 11 shows the heat source 1004 directing a laser beam 1012 into a Wollaston prism 1100. Wollaston prisms are well known in the art and are able to receive a single input beam 1012 and produce two output beams 1102 and 1104. Through the use of one or more Wollaston prisms, a single laser 1004 can produce multiple hot spots. It is important to realize that other beam splitting elements can be used as well and they are well-know by those of ordinary skill in the art.

Figure 12:
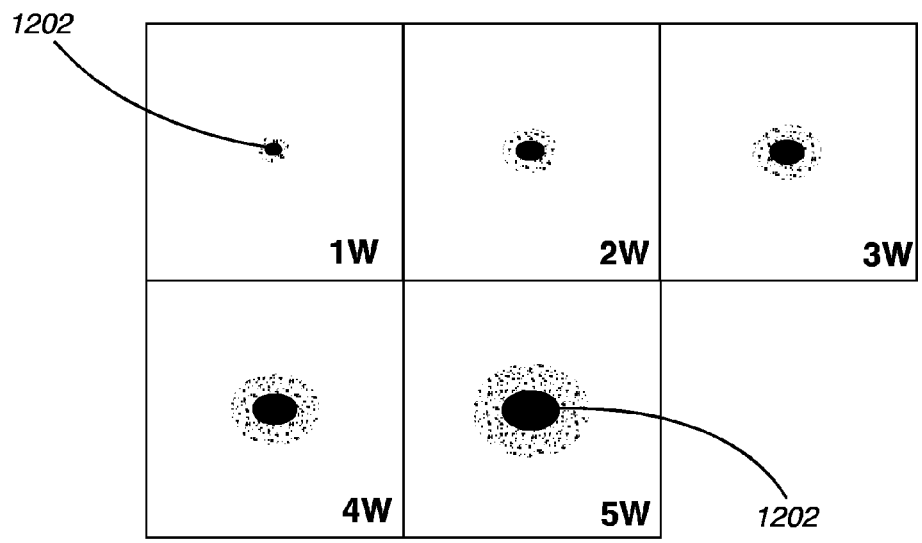
FIG. 12 is a graphical illustration of temperature distributions caused by application of varying power levels of a heat source to a heat pipe, according to an embodiment of the present invention.

Referring now to FIG. 12, illustrated are five measured temperature distributions of a state of the art heat pipe 110 with different laser powers of 1 Watt to 5 Watt, respectively, simulating a high power density region of an electronic device, are shown. The image size is 35 mm×35 mm and the initial laser spot 1202 shows a Gaussian distribution of 1.95 mm and 1.61 mm as 1/e2 full width. The laser spot 1202 is elongated because, as can be seen in FIG. 10, the laser beam 1012 is not hitting the surface 1010 of the heat pipe 110 at normal incidence. As can be seen in the series of 5 image depictions in FIG. 12, as the power increases, so too does the size of the hot spot maximum temperature region. However, the more efficient the cooling device, the smaller the hot spot will be at a given power. Knowing this characterization information for a particular cooling device allows for the most efficient and optimal design.

Although, so far, the present invention has been shown and described in conjunction with a cooled block cooling system, other embodiments will work equally as well. For instance, the cooling device can be replaced with a simple heatsink or heatsink/fan assembly.

Blackbody Coating

Under certain circumstances it may be preferred to coat the heat pipe surface 1010 with a thin blackbody coating. This coating helps to absorb the laser beam and increases the emissivity of the cooling device, which improves the temperature measurements. The coating is preferably as thin as possible so that it does not alter the thermal behavior of the cooling device. Several good blackbody coatings shown to be used advantageously is black paint, a Cr coating on a rough (rougher than the detected wavelength of the blackbody radiation) surface, or a carbon coating. The thickness should be less than 0.1 micron, which will be sufficient for boosting the emissivity and to absorb the laser light.

Bias Heat

Figure 13:
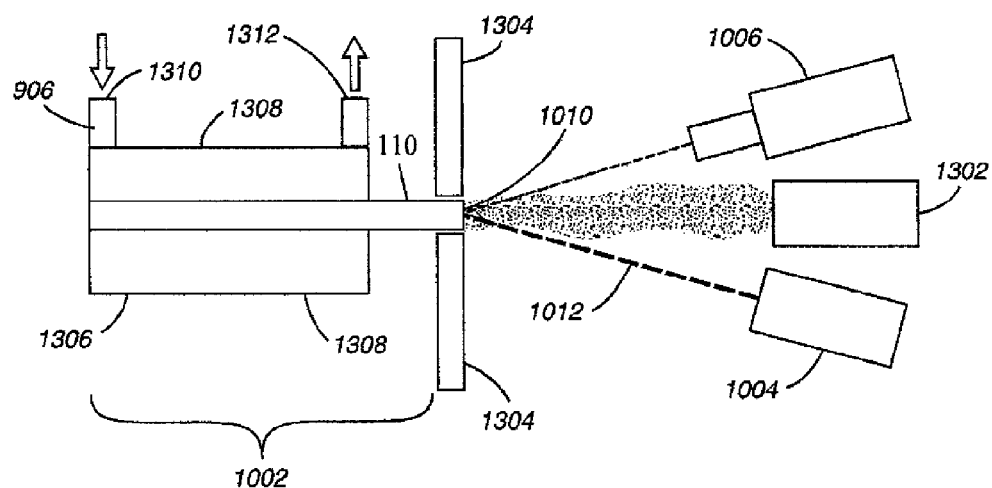
FIG. 13 is a cross-sectional diagram of an operational heat pipe encased in a cooling block and the application of a focused heat source and a bias heat source to the heat pipe and the detection of thermal characteristics by a thermal detector, according to an embodiment of the present invention.

In an embodiment shown in FIG. 13, in addition to a hot spot generated by the laser 1004, a bias heat flux is applied to the surface 1010 of the heat pipe 110 using the heat from a directed hotgun 1302. Instead of the hotgun 1302, a high power UV lamp or a laser diode array may be used to provide the bias heat flux. Adding bias heat better simulates conditions found in actual use, as most electronic devices 104 do not provide a single hot spot, but rather provide a generally much higher than ambient temperature across the entire body of the electronic device 104. In order to avoid stray heating of the water-cooled cold block 1308 by the hotgun 1302, a shield 1304 is provided to block the hot air of the hotgun 1302 from the water-cooled cold block 1308.

Referring again to FIG. 13, it can be seen that in one embodiment of the present invention, slots 1306 and 1308 are provided in the water-cooled cold block 1308 for the insertion of thermocouples (not shown). The slots 1306 and 1308 are on opposite ends of the water-cooled cold block 1308 so that the thermocouples can monitor the heat pipe boundary temperatures. In another embodiment, a difference in temperature of the working fluid 906 between the inlet 1310 and the outlet 1312 is measured along with the flow rate (volumetric or mass flow rate) of the working fluid 906 to determine an amount of power absorbed by the cooling device 1002. An increase in temperature of the working fluid 906 between the inlet and the outlet directly corresponds to power absorbed by the cooling device 1002. In yet another embodiment, the wick temperature is measured to further characterize the cooling device 1002.

Figure 14:
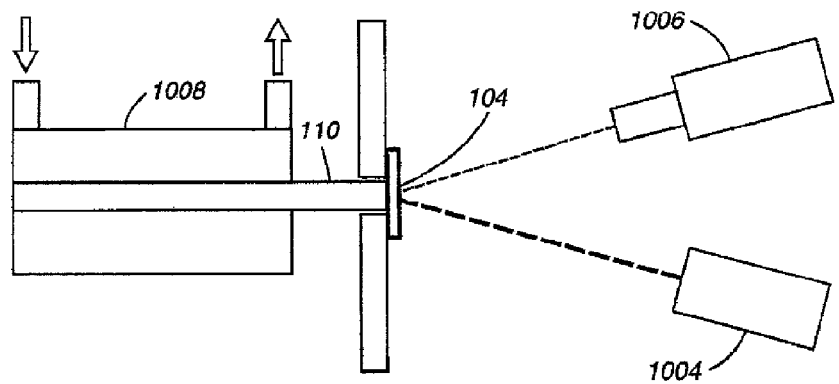
FIG. 14 is a cross-sectional diagram of an operational heat pipe encased in a cooling block and the application of a heat source to a test chip coupled to the cooling block through a thermally conductive interface and the detection of thermal characteristics by a thermal detector, according to an embodiment of the present invention.

Characterization of Temperature of Complete Cooling Package Under Non-Uniform Heat Load As explained above, and now shown in FIG. 14, a test chip 104 can be physically coupled to the cooling device 1002. Further, a thermally conductive interface can be used to measure the temperature of the complete cooling package. In this embodiment, the test chip 104 has a heater 1508 patterned on the circuitry side (facing towards the camera 1006 and not shown in this view) of the test chip 104. Directed heat from the heat source 1004 is then applied onto the test chip 104. The test chip 104 can provide bias heat if power is applied to the heater 1508. The directed heat from the heat source 1004 creates a hot spot on the test chip 104, which is then thermally transferred onto the heat pipe 110.

Measuring the thermal distribution on the circuitry side of the test chip 104 (towards the camera 1006) allows a characterization of the complete cooling package including the test chip and the thermal interface (not shown). For instance, if the temperature at the hot spot applied by the heat source 1004 becomes large in size, it can therefore be determined that the cooling device 1002 is unable to remove a sufficient amount of heat from the test chip 104. Alternatively, if the temperature of the hot spot remains relatively small, it is then known that the cooling device 1002 is capable of carrying away at least a portion of the heat being applied by the heat source 1004 and that, in actual use, a working electronic device with a similar hot spot will not damagingly heat adjacent areas on the working electronic device.

Characterization of Temperature Difference Across the Thermal Interface

Figure 15:
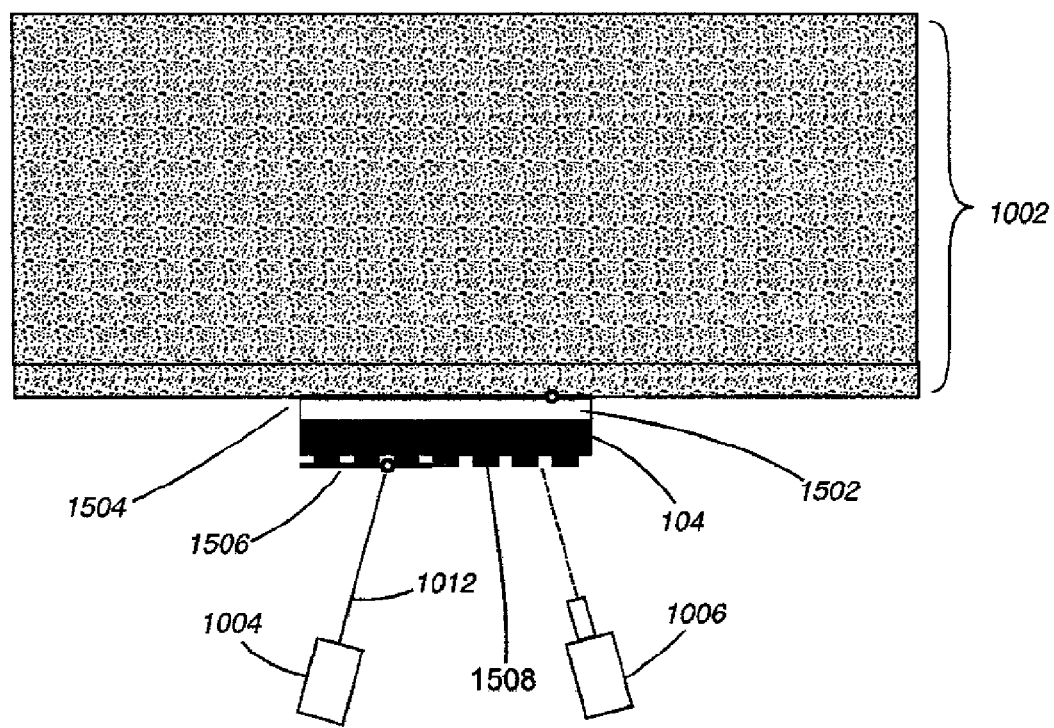
FIG. 15 is a cross-sectional diagram of a heat sink coupled to an electronic device, with a thermally conductive interface, illustrating how to measure a temperature difference between the thermal interface material according to an embodiment of the present invention.

Referring now to FIG. 15, another embodiment of the present invention is shown where a test chip 104 is coupled to a cooling device 1002. In this embodiment, the test chip 104 is constructed of a transparent material, such as silicon. An oil interface 1502 is placed between the test chip 104 and the cooling device 1002 to facilitate an efficient thermal coupling between the two devices. In addition, a blackbody coating 1504 is provided between the oil interface 1502 and the cooling device 1002, and a second blackbody coating 1506 partially covers a surface of the test chip 104 opposite a surface facing the cooling device 1002. Different coatings, which are thin enough not to influence the thermal properties, can help to absorb a laser beam at different locations of the test chip 104 and control the temperature measurements using the IR camera 1006.

The configuration shown in FIG. 15 may provide for a characterization of the thermal interface material, such as the oil interface 1502, in actual use. In one embodiment, the heater 1508 of the test chip 104 is used to heat the oil interface 1502. By measuring the thermal distribution at the oil interface 1502 and at the second blackbody coating 1506, the temperature difference across the thermal interface material and the test chip 104 can be inferred, and, in combination with the electrical power in the heater 1508, the thermal resistance can be derived. In another embodiment, the interface surface between the test chip 104 and the oil interface 1502 is coated with a black body coating. In that case, the temperature difference just across the thermal interface can be measured. The general idea is that by applying the black body coating at different locations, individual elements of the cooling package can be measured separately. In addition, a laser beam 1012 from the heat source 1004 applied to different parts of the cooling package can help to measure the thermal response under non-uniform heat load.

Computer System for Computing Thermal Measurements

Figure 16:
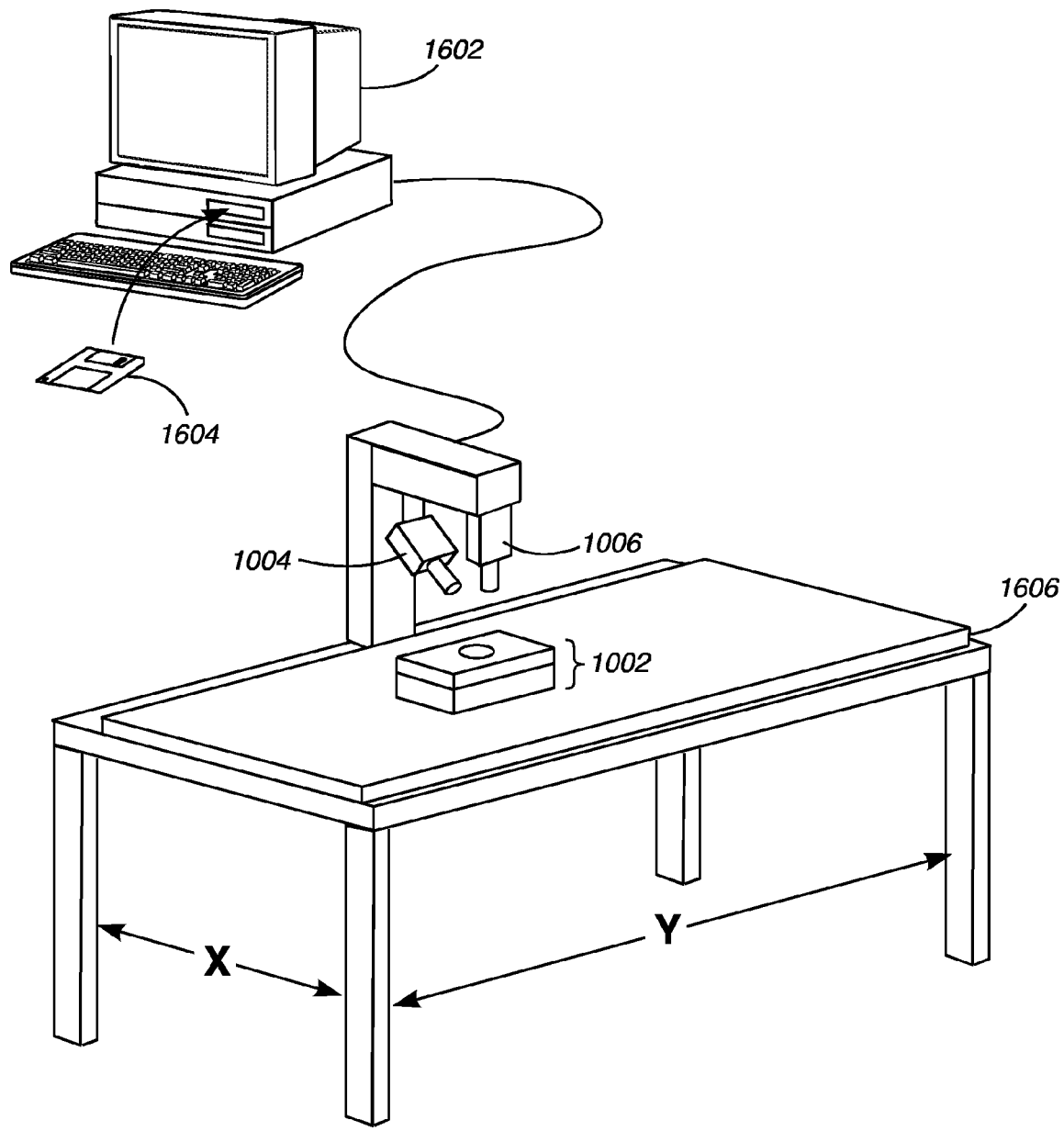
FIG. 16 is a block diagram of a system for measuring temperature and power distributions of a fully operating electronic device, according to an embodiment of the present invention.

FIG. 16 shows a system 1600 for measuring thermal characteristics of a cooling device in accordance with the present invention. The system 1600 includes a computer 1602 and a computer readable medium 1604 that holds instructions that the computer can execute in accordance with the present invention. The computer 1602 is connected to table 1606 that holds the cooling device 1002. Located above the device 1002 is a heat source 1004 and an infrared camera 1006.

By placing the computer readable medium 1604 into the computer 1602, the computer 1602 can read instructions contained on the medium 1604 and control the system 1600 to measure the thermal characteristics of the cooling device 1002. In one embodiment, the heat source 1004 and camera 1006 move in relation to the device 1002 in the X-Y direction. In a second embodiment the table 1606 moves the device 1002 in the X-Y directions in relation to the camera 1006 and heat source 1004. In yet another embodiment, the camera 1006 and heat source 1004 are able to move independent of one another. The computer 1602 is able to control the movements in either embodiment.

The computer 1602 is able to communicate with the temperature detector 1006 and record the temperature values of the regions on the device 100. The computer can then quickly process the information and solve equations for characterizing the cooling device.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An apparatus for thermally characterizing an operational cooling device for an electronic device, the apparatus comprising:
   an operational cooling device;
   a localized heat source for applying a focused heat to at least one localized region on the operational cooling device;
   a system, coupled to the operational cooling device and to the localized heat source, for moving the localized heat source relative and the operational cooling device to more than one position relative to each other to direct the focused heat from the localized heat source to more than one localized region of the operational cooling device;
   a temperature detector for measuring a temperature distribution on the operational cooling device; and
   a bias heat source other than a test chip or electronic device, for applying, independently of the localized heat source, a uniform heat to a larger area of the operational cooling device than the area of the at least one localized region.

2. The apparatus according to claim 1, wherein the temperature detector for measuring a temperature distribution on the operational cooling device measures a temperature on the operational cooling device when the localized heat source and the operational cooling device are at each position of the more than one position relative to each other.

3. The apparatus of claim 2, wherein the bias heat source comprises at least one of an ultraviolet (UV) lamp, a laser diode array, an electromagnetic radiator and a directed convective heat flow generator.

4. The apparatus according to claim 2, wherein the operational cooling device comprises at least one of a heat pipe, a vapor chamber, a cold plate, a mini-channel, a microchannel, and a fan or a pump or a compressor.

5. The apparatus according to claim 2, wherein the temperature detector comprises at least one of an infrared (IR) thermal imager, a fluorescence imager, and a charge-coupled device (CCD) camera.

6. The apparatus according to claim 2, wherein the operational cooling device is coated at least partially with a blackbody coating to enhance measurement of the temperature distribution.

7. The apparatus according to claim 1, wherein the localized heat source comprises a laser for producing a laser beam.

8. An apparatus for thermally characterizing an operational cooling device for an electronic device, the apparatus comprising:
   an operational cooling device;
   a localized heat source for applying a focused heat to at least one localized region on the operational cooling device;
   a system, coupled to the operational cooling device and to the localized heat source, for moving the localized heat source relative and the operational cooling device to more than one position relative to each other to direct the focused heat from the localized heat source to more than one localized region of the operational cooling device; and
   a temperature detector for measuring a temperature distribution on the operational cooling device,
   wherein the temperature detector for measuring a temperature distribution on the operational cooling device measures a temperature on the operational cooling device when the localized heat source and the operational cooling device are at each position of the more than one position relative to each other.

9. The apparatus according to claim 8, wherein the localized heat source comprises a laser for producing a laser beam.

10. The apparatus according to claim 9, further comprising:
    at least one beam splitting optical element for splitting the laser beam into at least two paths for applying the focused heat to a plurality of localized regions on the operational cooling device.

11. The apparatus according to claim 8, further comprising:
    a bias heat source other than a test chip, for applying, independently of the localized heat source, a uniform heat to a larger area of the operational cooling device than the area of the at least one localized region.

12. The apparatus of claim 11, wherein the bias heat source comprises at least one of an ultraviolet (UV) lamp, a laser diode array, an electromagnetic radiator and a directed convective heat flow generator.

13. The apparatus according to claim 11, wherein the operational cooling device comprises at least one of a heat pipe, a vapor chamber, a cold plate, a mini-channel, a microchannel, and a fan/pump/compressor.

14. An apparatus for thermally characterizing an operational cooling device for an electronic device, the apparatus comprising:
    an operational cooling device;
    a laser for producing a laser beam for applying a focused heat to at least one localized region on the operational cooling device;
    a system, coupled to the operational cooling device and to the laser, for moving the laser relative and the operational cooling device to more than one position relative to each other to direct the focused heat from the laser to more than one localized region of the operational cooling device;
    a temperature detector for measuring a temperature distribution on the operational cooling device; and
    a bias heat source other than a test chip or electronic device, for applying, independently of the laser, a uniform heat to a larger area of the operational cooling device than the area of the at least one localized region.

15. The apparatus according to claim 14, further comprising:
    at least one beam splitting optical element for splitting the laser beam into at least two paths for applying the focused heat to a plurality of localized regions on the operational cooling device.

16. The apparatus according to claim 14, wherein the temperature detector for measuring a temperature distribution on the operational cooling device measures a temperature on the operational cooling device when the laser and the operational cooling device are at each position of the more than one position relative to each other.

17. The apparatus according to claim 14, wherein the test chip has a circuitry side and a side opposite the circuitry side, and wherein the side opposite the circuitry side is thermally coupled to the operational cooling device.

18. The apparatus of claim 17, wherein the bias heat source comprises at least one of an ultraviolet (UV) lamp, a laser diode array, an electromagnetic radiator and a directed convective heat flow generator.

* * * * *